(12) United States Patent
Charlton et al.

(10) Patent No.: US 6,778,933 B2
(45) Date of Patent: Aug. 17, 2004

(54) PROCESSING SEMICONDUCTOR DEVICES HAVING SOME DEFECTIVE INPUT-OUTPUT PINS

(75) Inventors: David Charlton, Star, ID (US); Sovandy Prak, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/315,594

(22) Filed: Dec. 10, 2002

(65) Prior Publication Data

US 2003/0125896 A1 Jul. 3, 2003

Related U.S. Application Data

(63) Continuation of application No. 09/207,090, filed on Dec. 7, 1998, now Pat. No. 6,510,443.

(51) Int. Cl.⁷ .............................................. G11C 29/00
(52) U.S. Cl. ........................................ 702/118; 702/117
(58) Field of Search ................................. 702/117, 118, 702/33–35, 38, 40, 57–59, 64, 65, 81–84, 108, 119–123, 170, 172, 182–185, FOR 170, FOR 171, FOR 103–FOR 106, FOR 123–FOR 125, FOR 131, FOR 134, FOR 135, FOR 137, FOR 138; 700/109, 110, 115–121; 365/201; 438/5, 7, 10–12, 14, 16–18; 382/141, 144–146, 147, 149; 209/571–574; 324/73.1, 764, 765, 555, 761, 158.1, 763, 515, 532, 755; 714/724, 718, 725

(56) References Cited

U.S. PATENT DOCUMENTS

| | | | | |
|---|---|---|---|---|
| 5,093,982 A | * | 3/1992 | Gussman | 29/705 |
| 5,400,263 A | | 3/1995 | Rohrbaugh et al. | 364/490 |
| 5,726,920 A | | 3/1998 | Chen et al. | 364/579 |
| 5,761,145 A | | 6/1998 | Zagar et al. | 365/226 |
| 5,954,832 A | * | 9/1999 | LeBlanc | 714/724 |
| 6,104,985 A | * | 8/2000 | Sowards | 702/117 |
| 6,119,049 A | * | 9/2000 | Peddle | 700/121 |
| 6,125,460 A | * | 9/2000 | Sim | 714/718 |
| 6,161,053 A | | 12/2000 | Chen et al. | 700/121 |

* cited by examiner

Primary Examiner—Hal D Wachsman
(74) Attorney, Agent, or Firm—Trop, Pruner & Hu, P.C.

(57) ABSTRACT

Techniques to process semiconductor devices whose input-output (I/O) pins are only partially operative is able to accommodate substantially all possible combinations of operative I/O pin patterns. Semiconductor devices are tested to determine which I/O pins are operative. A code representing which I/O pins are operative is then associated with each tested device. The generated codes are used to selectively combine two or more semiconductor devices to form a component capable of providing the function of a single fully operational semiconductor device.

17 Claims, 5 Drawing Sheets

PROCESSING SEMICONDUCTOR DEVICES HAVING SOME DEFECTIVE INPUT-OUTPUT PINS

CROSS-REFERENCE TO RELATED APPLICATION

This is a continuation of U.S. Ser. No. 09/207,090, filed Dec. 7, 1998, now U.S. Pat. No. 6,510,443.

BACKGROUND

The invention relates generally to processing semiconductor devices having a number of non-functional input-output (I/O) pins.

During the manufacture of semiconductor devices, pin failures may occur that render the device partially inoperative. Rather than discarding such devices, two or more partially defective devices may be combined to form a component that, functionally, performs as one non-defective device. For example, a first random access memory (RAM) device having 16 I/O pins, of which 7 are inoperative, may be combined with one or more additional RAM devices (the collection of additional RAM devices having at least 7 operative I/O pins) to form a single memory component—the component functioning as a single 16 I/O pin RAM device.

A typical semiconductor device manufacturing and testing process is shown in FIG. 1. Following device manufacture (block 100), initial testing is performed to determine if the device is fully operational (block 102). If the device is fully operational (the 'yes' prong of block 104), it may be used immediately in the manufacture of electronic systems (block 106). If the device is not fully operational (the 'no' prong of block 104), it may be collected with other partially defective devices into lots (block 108) that may undergo further testing (block 110).

Semiconductor device testing may be performed by the combination of a test machine (hereinafter a "tester") and a loader/unloader (hereinafter a "handler"). A tester may be used to determine which of a device's I/O pins are operational through, for example, electrical tests. Handlers may be used to physically move devices into and out of a tester. Current handlers are capable of taking a device from a tester and selectively placing it into one of only a limited number of output positions or bins. For example, the Aetrium 3200 handler manufactured by Aetrium Incorporated, may place a tested device into one of ten output bins. This limitation may significantly restrict the use of partially operative devices. For example, a 16 I/O pin RAM device has more than 65,000 possible operative (or inoperative) I/O pin combinations. Since handlers may place components into only a small number of output bins (e.g., 10), however, only that number of operative I/O pin combinations may be categorized for subsequent use.

Referring again to FIG. 1, if during block 110 a device is found to have a pattern of operative I/O pins that correspond to one of a limited number of previously specified output patterns (the 'yes' prong of diamond 112), it may be placed in the appropriate output bin and combined with other partially operative devices to form a functional component (block 114). If a device's pattern of operational I/O pins fail to meet one of the previously specified output patterns (the 'no' prong of diamond 112), it may be discarded (block 116).

Because handlers can accommodate only a limited number of output bins, the number of operational output pin patterns specified in diamond 112 may be only a fraction of the total possible patterns. Thus, many devices that may be useful in the manufacture of functional components may be discarded. For example, if a specified I/O pin pattern requires that pins 0 through 7 and 12 through 16 be operative, then a device having operative I/O pins 1 through 8 and 12 through 16 may be discarded, even though it may be used to assemble functionally equivalent components as a device having the specified pattern of operative I/O pins.

Because the cost of discarding partially operational devices is becoming increasingly important in driving the cost of finished products, it would be beneficial to provide a mechanism that is capable of accommodating substantially all possible combinations of operative I/O pin patterns. It would be a further benefit to provide this capability without incurring the cost of modifying handlers to expand their output placement capacity.

SUMMARY

In one embodiment the invention provides a method to process partially defective semiconductor devices. The method includes identifying a parameter, identifying a first semiconductor device having a first defect (the first defect related to the parameter), and identifying a second semiconductor device having a second defect based on the identified parameter, the first defect, and the second defect. In one embodiment of the invention, the semiconductor devices are semiconductor memory devices, which may be combined to form a component; the component capable of providing the function of a single fully operational semiconductor memory device. In another embodiment, the component may include more than two partially defective semiconductor devices.

A method in accordance with yet another embodiment of the invention includes testing a plurality of semiconductor memory devices (each semiconductor memory device having a plurality of input-output pins), identifying an operational state of each of the plurality of input-output pins for each of the plurality of semiconductor memory devices, generating a code indicating the operational state of each of the plurality of input-output pins for each of the plurality of semiconductor memory devices, and associating each generated code with an identifier of the semiconductor memory device tested to generate the code. The act of testing may comprise determining a number of operational input-output pins for each of the plurality of semiconductor memory devices. The act of generating a code may comprise generating a hexadecimal code indicating which input-output pins are operational. The act of associating each generated code with an identifier of the semiconductor memory device tested to generate the code may comprise storing the code and the unique identifier in a database record.

Methods in accordance with the invention may be stored in any media that is readable by a programmable control device such as a computer processor.

DETAILED DESCRIPTION

Figure 1:
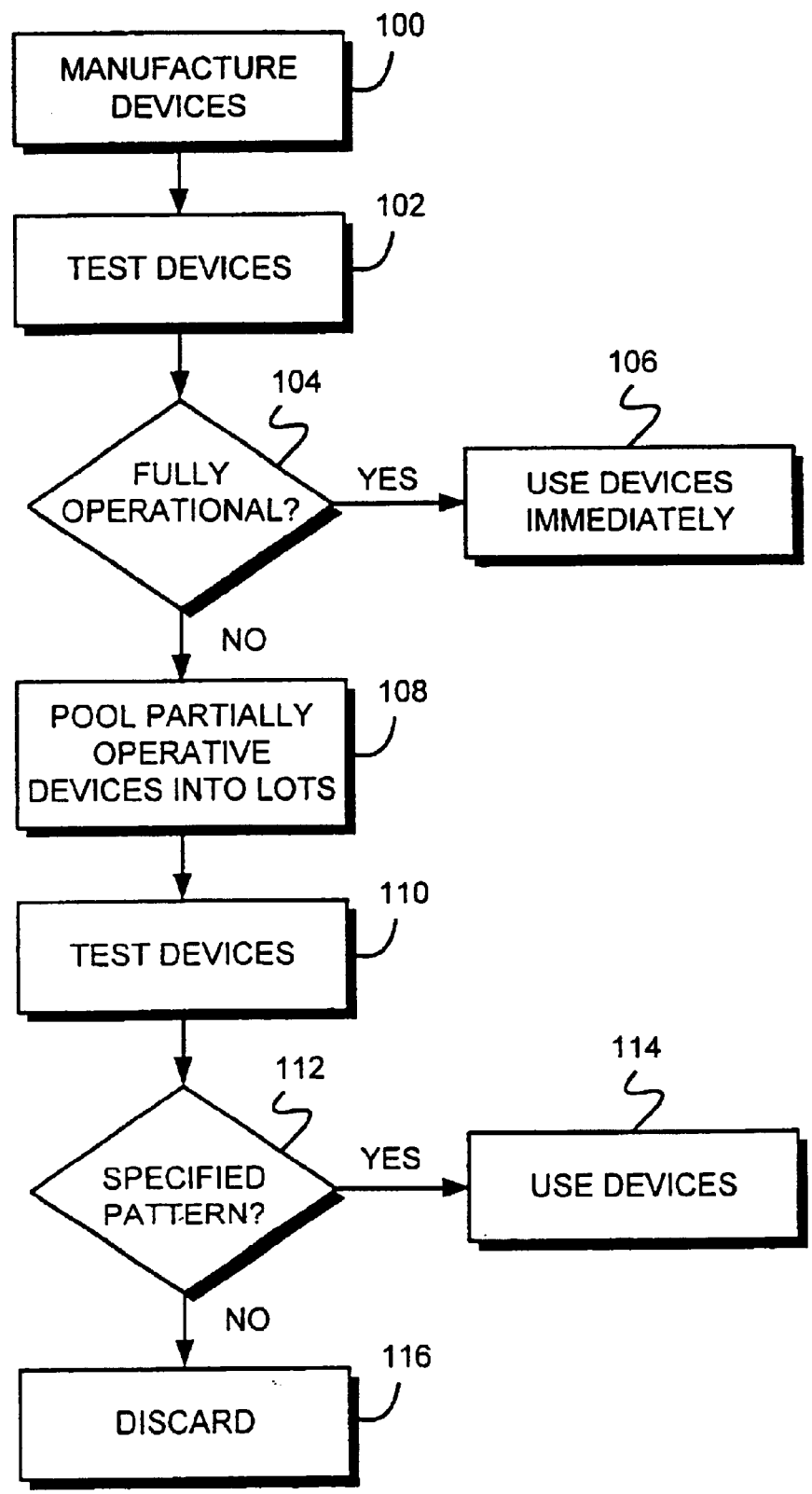
FIG. 1 shows a prior art semiconductor device manufacture and test process.
Figure 2:
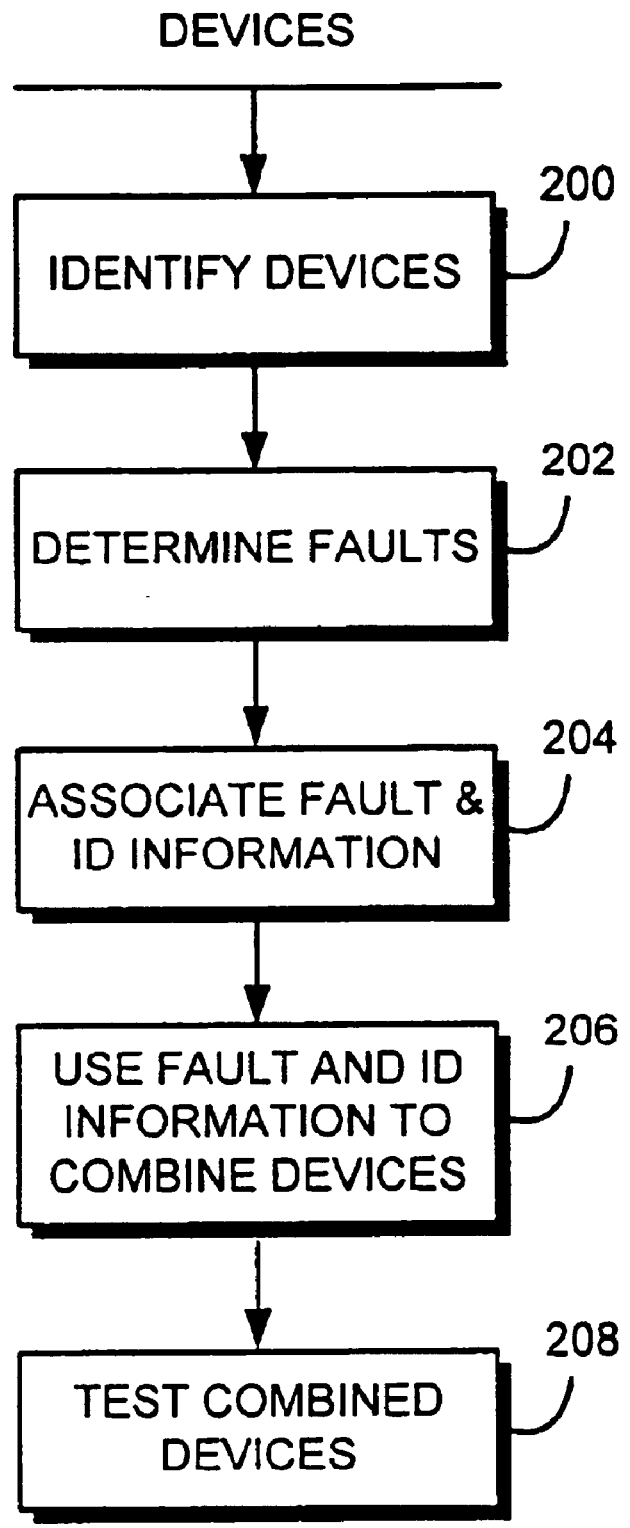
FIG. 2 shows a method in accordance with one embodiment of the invention to process partially defective semiconductor devices.

Referring to FIG. 2, a technique to process semiconductor devices in accordance with one embodiment of the invention includes identifying (block 200) and testing (block 202) each device to determine which pins are defective (or operative). Following testing, each device's fault and identity information are associated for future reference (block 204). In one embodiment, a device's pattern of operative input-output (I/O) pins may be physically indicated on the device itself. In another embodiment, a device's identification and fault information may be stored in a memory, perhaps in a database file. Based on devices' identification and fault information, partially operative devices may be combined to form components that are functionally equivalent to fully operational devices (block 206). Once a component has been assembled, it may be tested to ensure proper operation (block 208).

The following embodiments of this inventive concept, which provide the capability to process devices having substantially any pattern of operative I/O pins, are described in terms of processing random access memory (RAM) devices and are illustrative only and are not to be considered limiting in any respect. For example, if a first memory device has (N−x) operational I/O pins, and a second memory device has at least x operational I/O pins, the two devices may be combined to form a memory component having an N-wide I/O path. Components may also be combined with other components and/or fully functional devices to form modules.

Figure 3:
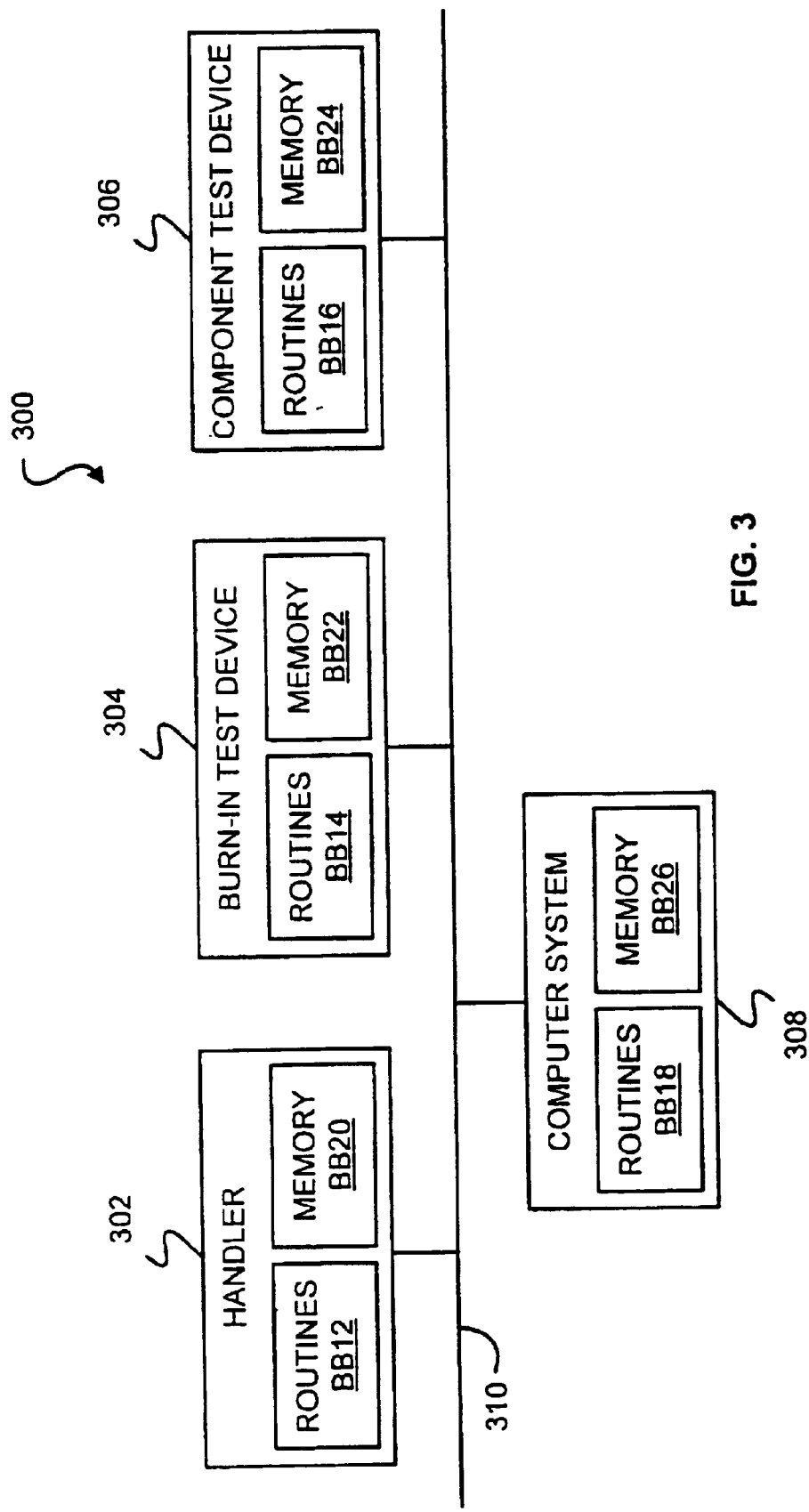
FIG. 3 shows a system to process partially operative memory devices in accordance with one embodiment of the invention.

Referring to FIG. 3, one embodiment of a semiconductor device processing system 300 in accordance with the invention includes handler (loader/unloader) 302, burn-in test device 304, component test device 306, and computer system 308 coupled through communication network 310. Illustrative handlers 302 include the Aetrium 3200 manufactured by Aetrium Incorporated. The Aetrium 3200 may move individual devices into and out of a test device and can accommodate up to 10 output bins. Illustrative burn-in test devices 304 include those test stations that may subject devices to complete electrical tests at either ambient or elevated and/or reduced temperatures. Illustrative component test devices 306 include the J996 Memory Test System manufactured by Teradyne Incorporated. The J996 Memory Test System may provide device speed, I/O pin current leakage, current draw, and noise immunity testing. An illustrative computer system 308 includes a computer server or workstation such as those manufactured by Micron Electronics, Incorporated. Each element in processing system 300 may include routines (312, 314, 316, and 318) to control the operation of their respective element, including communication with other system elements, and memory (320, 322, 324, and 326) in which to store those routines and other data. Communication network 310 may be, for example, a computer network controlled in accordance with the transport control protocol (TCP).

Figure 4:
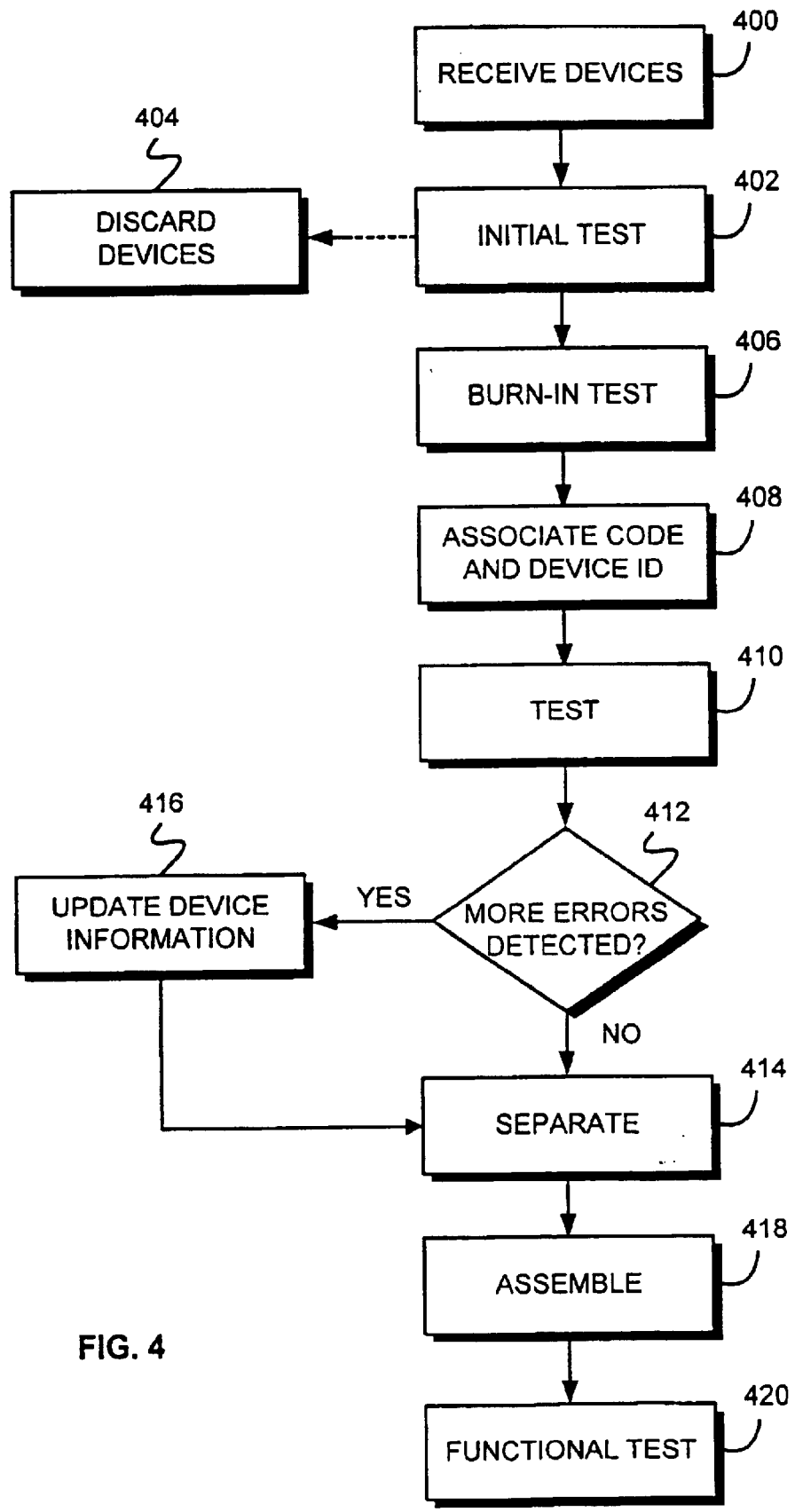
FIG. 4 shows another method to process partially operative memory devices in accordance with one embodiment of the invention.

Referring to FIG. 4, one embodiment of a method in accordance with the invention includes receiving memory devices, generally in collections identified by lot number (block 400). Following reception, an initial test may be performed to determine if the devices are at least partially operative (block 402). For example, initial tests may determine if a device's voltage or power circuitry is operative. Those devices that are non-functional are discarded (block 404).

Handler 302 may be used to place those devices that pass initial testing (block 402) into burn-in tester 304 (block 406). In one embodiment, handler 302 may be used to populate a burn-in test board having up to 192 memory devices which are then tested by burn-in tester 304 under control of routines 314. Tester 304, in turn, may generate a code indicative of each tested device's operational input-output (I/O) pins. In one embodiment, the code may be a hexadecimal value. For example, a hexadecimal value of 0×FF01 may indicate that I/O pins 0 and 8 through 15 are operative while pins 2 through 7 are inoperative. A unique identifier for each tested device and the device's fault information (e.g., I/O pin code) may be stored in memory 322 during testing (block 408). Test results for each tested device may be transmitted from tester 304 to computer system 308 via communication network 310. The transmitted information may be in the form of a first database file. In one embodiment of the invention, device identification information may be a combination of lot identification number and a device's location on the test board. In another embodiment, device identification information may be provided by the device itself through, for example, a fuse. (As would be known to those of ordinary skill, the term fuse refers to device identification information that is stored internal to a device and which may be obtained through a specified read operation of the device).

Figure 5:
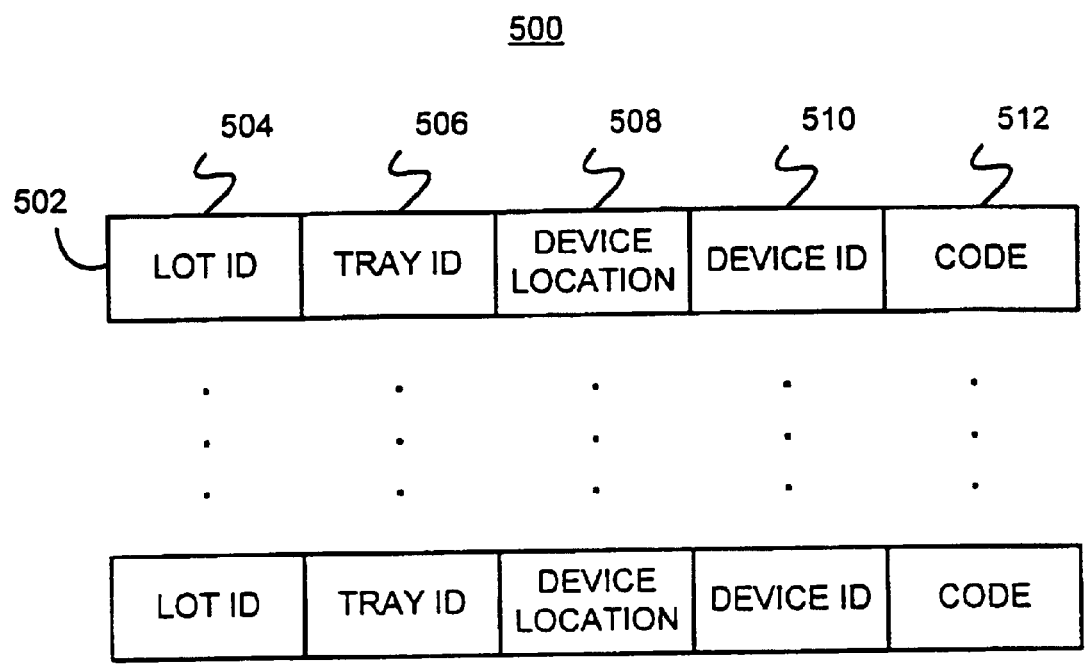
FIG. 5 shows a file structure to store partially operative device information in accordance with one embodiment of the invention.

Following completion of burn-in testing (block 406), handler 302 may remove each tested device from tester 304 and places it into a uniquely identified process tray having a known number of locations. Process trays may, for instance, be bar coded with a tray identification number readable by handler 302. For example, process trays manufactured in accordance with the joint electronic device engineering council (JEDEC) may have 96 locations arranged in a 12×8 grid. A second database file may be created to associate each device placed into a process tray with its I/O pin code. As shown in FIG. 5, the second database file 500 may comprise one entry (e.g., 502) for each tested device. Database file 500 may be stored, for example, in memory 326. Entry 502 may include lot identification number 504 (e.g., lot 12345), process tray identification number 506 (e.g., tray 54), device location 508 (e.g., row 5, column 9), device identification 510 (e.g., obtained through a device fuse), and the device's I/O pin code 512. Database file 500 may be a file distinct from the first database file. Alternatively, the first database file may be amended or modified to include the information illustrated in FIG. 5.

Following the act of associating a device's I/O pin code with a specific device identifier (block 408 of FIG. 4), devices are generally tested one or more times by component tester 306 to ensure their viability in a finished product (block 410). Illustrative component tests include device speed tests, pin-to-pin current tests, current drain measurements, voltage-on low and high tests, and noise immunity tests. Component test device 306 may determine, on a device-by-device basis, which I/O pins to test. This determination may be based on a device's I/O pin code—I/O pins previously determined to be inoperative may not be retested here. Test device 306 may, for example, obtain a device's operative I/O pin code from computer system 308 (e.g., database file 500) via communication network 310.

If test device 306 does not detect additional I/O pin errors (the 'no' prong of diamond 412), the devices may be removed from tester 306 and separated into uniquely identified process trays by handler 302 (block 414). For example, if 8M×8 memory devices are being processed, tested devices may be separated into one of eight process trays—one tray may include up to 96 devices all of which have one operative I/O pin, another tray may include up to 96 devices all of which have two operative I/O pins, and so on.

If test device 306 determines a device has more non-operative I/O pins than are indicated by it's I/O pin code (the 'yes' prong of diamond 412), that device's I/O pin code may be updated (block 416). In one embodiment, the act of updating a device's fault information generates another database file (for example, a third database file in accordance with FIG. 5). In another embodiment, an existing database file is simply updated/altered to reflect the new I/O pin code. Following the act of updating (block 416), processing continues at block 414.

Figure 6:
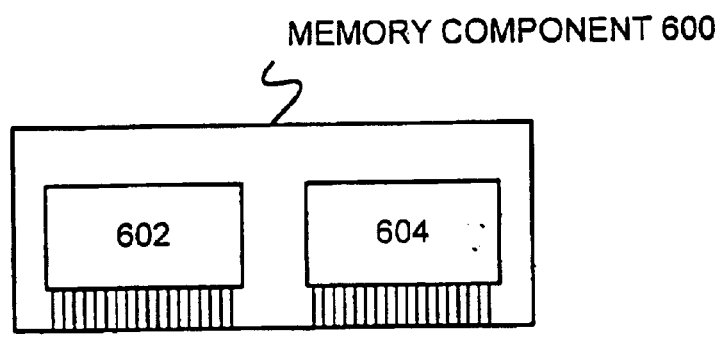
FIG. 6 shows a memory module comprising partially operative memory devices assembled in accordance with one embodiment of the invention.

After separation (block 414), devices may be matched based on their I/O pin codes and assembled into components and/or modules (block 418). As shown in FIG. 6, an 8M×16 memory component 600 may be assembled from an 8M×16 device having 7 operative I/O pins 602 and another 8M×16 device having at least 9 operative I/O pins 604. Equipment, such as a pick-and-place device, programmed to assemble component 600 may use the I/O pin codes stored for each process tray to determine which specific devices to combine. Input-output pin code information may also be used to disable a selected device's non-operative I/O pins. Finally, assembled components may be tested to ensure their proper functional behavior, e.g., that they operate as a single 8M×16 memory device (block 420). In addition, components may be combined with other components and/or devices to form modules, e.g., memory modules.

In an alternative embodiment, tested devices (those devices supplied to block 414) are not separated. Instead, devices may be selected based on their pin code and location identification—tray identification 506 and device location 508 values. That is, once a first semiconductor device is selected, subsequent semiconductor devices may be selected by identifying which tested devices may be combined with the first device to form a functional component.

Various changes in the materials, components, circuit elements, as well as in the details of the illustrated operational method are possible without departing from the scope of the claims. For instance, the illustrative system of FIG. 3 and process of FIG. 4 may be applied to various types of random access, read only, and flash memories, as well as other devices such as ferroelectric memories. In addition, elements of process system 300 may communicate directly with one another rather than through computer system 308. Further, handler 302 may be under control of routines 312, an external element such as computer system 308, or a combination of these elements. Similarly, test device 306 may be under control of routine 316, computer system 308, or a combination of these elements. In another embodiment, tested devices may be associated with their I/O pin code by physically labeling each device in a manner that may be interpreted by a handler and/or an assembly device such as a pick-and-place machine. For example, each device may have a bar code applied to it that encodes its fault information.

Acts in accordance with FIG. 4 may be performed by a programmable control device executing instructions organized into a program module (e.g., routines 312, 314, 316, and/or 318). A programmable control device may be a single computer processor, a plurality of computer processors, or one or more custom designed state machines. Custom designed state machines may be embodied in a hardware device such as a printed circuit board comprising discrete logic, integrated circuits, or specially designed application specific integrated circuits (ASICs). Storage devices suitable for tangibly embodying program instructions include all forms of non-volatile memory including, but not limited to: semiconductor memory devices such as EPROM, 6PROM, and flash devices; magnetic disks (fixed, floppy, and removable); other magnetic media such as tape; and optical media such as CD-ROM disks.

What is claimed is:

1. A method to process partially defective devices each having plural pins, comprising:
   testing the devices to identify which pins are operational and which pins are inoperational;
   storing a code indicating an operational status of the pins; and
   prior to assembling the devices into a module, verifying the operational status of at least the pins indicated by the code as being operational.

2. The method of claim 1, wherein verifying the operational status comprises performing a second test of each device.

3. The method of claim 2, wherein performing the second test comprises performing at least one of a device speed test, pin-to-pin current test, current drain measurement, voltage-on low and high test, and noise immunity test.

4. The method of claim 3, wherein testing the devices to identify which pins are operational and which pins are inoperational comprises performing burn-in testing.

5. The method of claim 1, further comprising updating the code based on the verifying.

6. The method of claim 1, further comprising disabling one or more pins that are indicated by the code as being inoperational.

7. A method to process partially defective devices each having plural pins, comprising:
   testing the devices to identify which pins are operational and which pins are inoperational;
   storing a code indicating an operational status of the pins;
   prior to assembling the devices into a module, verifying the operational status of at least the pins indicated by the code as being operational; and
   storing an identifier of each of the devices, the identifier associated with the code.

8. The method of claim 7, wherein verifying the operational status uses the identifier and code of each device.

9. A program storage device, readable by a programmable control system, comprising instructions that when executed cause the programmable control system to:
   test devices to identify which pins of the devices are operational and which pins are inoperational;
   store a code indicating an operational status of the pins; and
   verify the operational status of at least the pins of the devices indicated by the code as being operational prior to assembling the devices into a module.

10. The program storage device of claim 9, wherein the instructions when executed cause the programmable control system to verify the operational status by performing a second test.

11. The program storage device of claim 10, wherein performing the second test comprises performing at least one of a device speed test, pin-to-pin current test, current drain measurement, voltage-on low and high test, and noise immunity test.

12. The program storage device of claim 11, wherein testing the devices to identify which pins of the devices are operational and which pins are inoperational comprises performing burn-in testing.

13. The program storage device of claim 9, wherein the instructions when executed cause the programmable control system to update the code based on the verifying.

14. A test system comprising:

a first tester to test devices to identify which pins are operational and which pins are inoperational;

a storage to store a code indicating an operational status of the pins; and a second tester to verify the operational status of at least the pins indicated by the code as being operational prior to assembling the devices into a module.

15. The test system of claim 14, wherein the second tester verifies the operational status by performing a second test.

16. The test system of claim 15, wherein the second test comprises at least one of a device speed test, pin-to-pin current test, current drain measurement, voltage-on low and high test, and noise immunity test.

17. The test system of claim 16, wherein the first tester comprises a burn-in tester.

* * * * *